United States Patent [19]

Kubota

[11] Patent Number: 5,023,311

[45] Date of Patent: Jun. 11, 1991

[54] HIGH-MOLECULAR-WEIGHT SOLUBLE NOVOLAK RESIN AND PROCESS FOR PREPARATION THEREOF

[75] Inventor: Takashi Kubota, Kamakura, Japan

[73] Assignee: Toray Industries, Inc., Tokyo, Japan

[21] Appl. No.: 277,509

[22] Filed: Nov. 30, 1988

Related U.S. Application Data

[63] Continuation of Ser. No. 937,905, Dec. 4, 1986, abandoned.

[30] Foreign Application Priority Data

Dec. 6, 1985 [JP] Japan .................................. 60-273375

[51] Int. Cl.$^5$ .................... C08G 8/04; C08G 8/08; C08G 8/10; G03C 1/60

[52] U.S. Cl. .................... 528/153; 430/165; 430/192; 525/504; 528/127; 528/155; 528/112; 528/165

[58] Field of Search ................ 525/504; 528/127, 165, 528/155, 162, 153; 430/165, 192

[56] References Cited

U.S. PATENT DOCUMENTS

| | | | |
|---|---|---|---|
| 3,672,886 | 6/1972 | Mammino | 525/504 X |
| 4,308,368 | 12/1981 | Kubo et al. | 525/504 |
| 4,345,054 | 8/1982 | Takeda et al. | 528/127 X |
| 4,377,631 | 3/1983 | Toukhy et al. | 430/165 X |
| 4,529,682 | 7/1985 | Toukhy | 528/162 X |
| 4,564,575 | 1/1986 | Perreault et al. | 430/169 X |
| 4,719,167 | 1/1988 | Miura et al. | 430/192 |
| 4,725,523 | 2/1988 | Miura et al. | 430/192 |
| 4,731,319 | 3/1988 | Kohara et al. | 430/192 |
| 4,797,346 | 1/1989 | Yamamoto et al. | 430/165 |
| 4,812,551 | 3/1989 | Oi et al. | 528/153 |
| 4,863,829 | 9/1989 | Furuta et al. | 430/192 |
| 4,876,324 | 10/1989 | Nakano et al. | 528/153 |

FOREIGN PATENT DOCUMENTS 0118291 9/1984 European Pat. Off. .

OTHER PUBLICATIONS

Chem. Abstracts, vol. 102, 1985, 63016e, Mitsui, effective date Oct. 30, 1984.
Chem. Abstracts, vol. 105, 1986, 173695v, Nakano, effective date Mar. 19, 1986.
Chem. Abstracts, vol. 105, 1986, 134843x, Nakano, effective date Jan. 21, 1986.
Chem. Abstracts, vol. 51, 1957, 11756h-i, 11757a-c, Burke et al.
Chem. Abstracts, vol. 105, 1986, 79884j, Nakano, effective date Apr. 5, 1986.
Chem. Abstracts, vol. 105, 1986, 25150y, Nakano, effective date Dec. 23, 1985.
Polymer, (1982), vol. 23, 263-266, Borrajo et al.

*Primary Examiner*—Howard E. Schain
*Attorney, Agent, or Firm*—Birch, Stewart, Kolasch & Birch

[57] ABSTRACT

Disclosed is a novel, organic solvent-soluble novolak resin having a high molecular weight and an inherent viscosity of at least 0.1. This high-molecular-weight novolak resin can be prepared with a good reproducibility by reacting an aldehyde with a polyfunctional phenol at an aldehyde/polyfunctional phenol molar ratio of from 0.85 to 1.20 in the presence of an acid catalyst in a solution state. This high-molecular-weight novolak resin is valuable as the resin component of a radiation-sensitive resist.

22 Claims, 1 Drawing Sheet

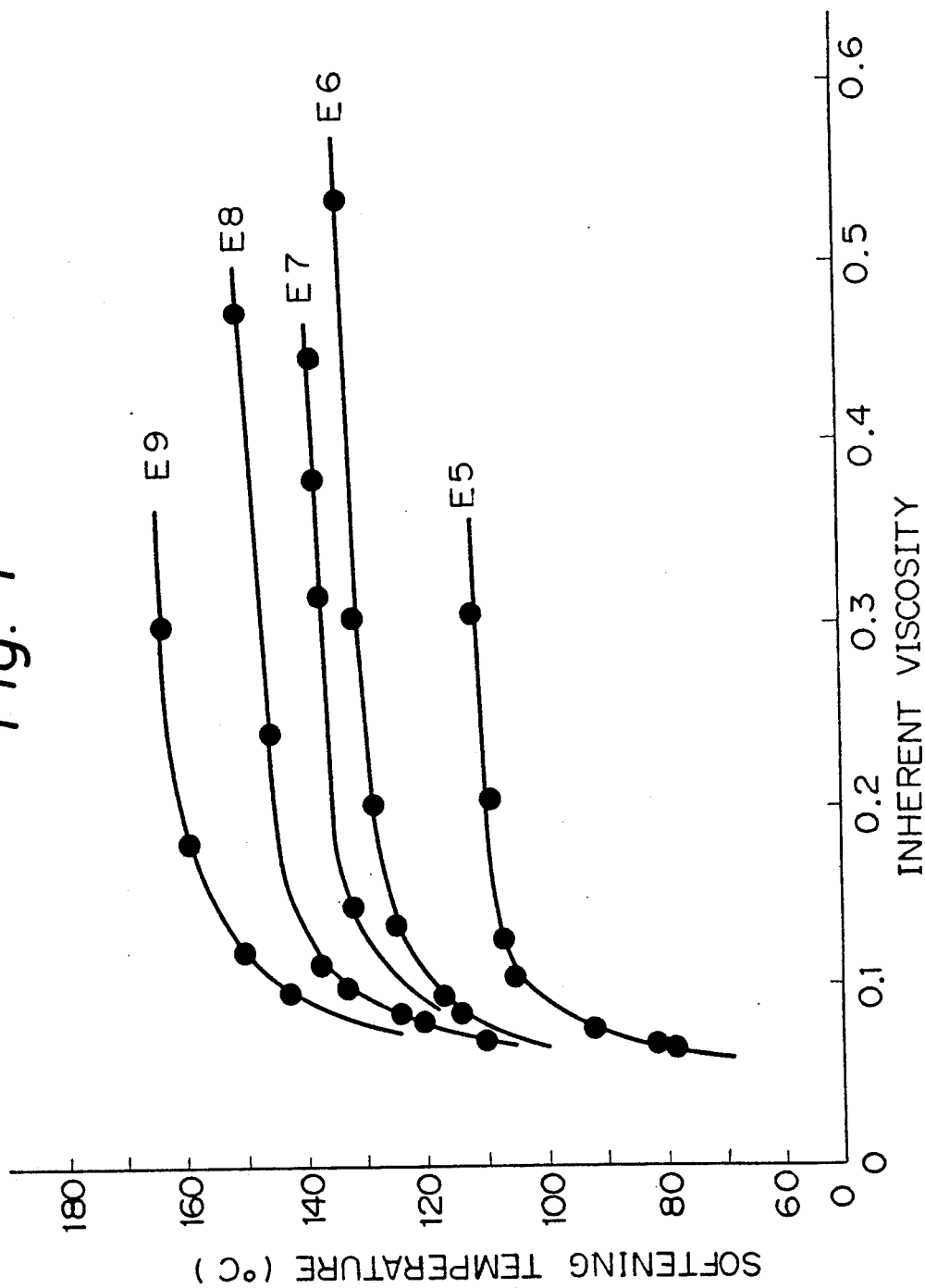

HIGH-MOLECULAR-WEIGHT SOLUBLE NOVOLAK RESIN AND PROCESS FOR PREPARATION THEREOF

This application is a continuation of application Ser. No. 06/937,905 filed on Dec. 4, 1986, now abandoned.

BACKGROUND OF THE INVENTION (1) Field of the Invention

The present invention relates to a substantially linear, high-molecular-weight soluble novolak resin and a process for the preparation thereof.

(2) Description of the Related Art

A phenolic resin obtained by curing and molding a soluble novolak type phenolic resin or a cresol type phenolic resin has long been known, and since this resin has such excellent heat resistance, infusibility, and flame retardancy, it cannot be replaced by other resins. Therefore, even now, this resin is very important and used in many fields.

The soluble phenolic resin, especially a novolak type phenolic resin obtained in the presence of an acidic catalyst (hereinafter referred to as "novolak resin"), can be easily modified by the introduction of various reactive groups. Further, the novolak resin is alkali-soluble and the content of the aromatic ring is high, and therefore, the novolak resin has an excellent heat resistance, and a plasma etching resistance. Moreover, because of the carbon content of the novolak resin is high, many characteristic carbonized materials can be formed. Because of these many excellent characteristics, this novolak resin is in demand as a photoresist for IC, a sealing material, a matrix resin for a composite material, or a new material for a carbon fiber or an active carbon fiber, and is regarded as an important material in many fields.

Although the conventional novolak resin has such excellent characteristics, it has disadvantages in that the softening point is low and the mechanical strength is unsatisfactory. Various causes of these disadvantages have been considered, but the largest cause is deemed to be a low molecular weight.

The upper limit of the number average molecular weight of the conventional novolak resin is regarded as being about 1,000. When the molecular weight is below 1,000, the melting point rises in accordance with the increase in the molecular weight, and within this range, the softening temperature depends greatly on the molecular weight. The same things can be said about other properties, and thus indicates that it is difficult to prepare a novolak resin having certain properties with a good reproducibility. One of the objects of the present invention is to prepare a high-molecular-weight novolak resin having certain properties with a good reproducibility.

Heretofore, various trials have been made to prepare high-molecular-weight novolak resins from phenols and aldehydes, especially formaldehyde or a derivative thereof, in the presence of an acidic catalyst. However, as pointed out in the thesis of Drumm [M. F. Drumm and J. R. LeBlanc, Kinet. Mech. Polym., 1972 (3), 157], it is considered difficult to obtain a novolak resin having a number average molecular weight exceeding 1,000.

J. Borrajo et al. theorized that if the reaction is carried out at a molar ratio of formaldehyde (F) to phenol (P) (which molar ratio is hereinafter referred to as "F/P molar ratio") adjusted to 0.881, when the formaldehyde is completely reacted, gelation is caused, and to prevent this gelation, i.e., insolubilization, the F/P molar ratio must be kept below 0.88 [J. Borrajo et al., Polymer, 23, 263 (1982)].

Japanese Unexamined Patent Publication (Kokai) No. 58-32,622 proposed a process in which a mixture of a phenol and a carbonyl compound is heated in the presence of an acidic catalyst to be thereby reacted to form a novolak resin having a high number average molecular weight and a very broad molecular weight distribution. Also in this process, to prevent gelation, for example, in the case of phenol and formaldehyde, the F/P molar ratio must be kept below 0.833.

As is well-known, to obtain a polymer having a high molecular weight, the F/P molar ratio must be 1.00, and at the F/P molar ratio of 0.833 as taught in Japanese Unexamined Patent Publication No. 58-32,622, a high molecular weight cannot be attained. If the molecular weight distribution of the novolak resin obtained under the above conditions is extremely broad, it is considered that the obtained resin is highly branched and extremely unstable.

It is admitted that even if a bifunctional phenol having no risk of insolubilization, such as o-cresol, p-cresol, o-chlorophenol or p-chlorophenol is used, it is difficult to obtain a phenolic resin having a high molecular weight. Japanese Unexamined Patent Publication No. 59-191,710 teaches that a novolak resin having a molecular weight of several thousands can be obtained only when special means is adopted. Nevertheless, it is taught that, even under such conditions, a gelatinous polymer is formed if the content of the bifunctional phenol is lower than 70 mole %, and a substantially linear novolak resin having a high molecular weight cannot be obtained.

Although various trials have been made to obtain novolak resins having a high molecular weight, as pointed out above, a practical technique capable of producing a novolak resin comprising a polyfunctional phenol as the main component, which has a high molecular weight and is soluble, for industrial utilization in a high yield economically advantageously, has not been discovered.

We carried out research with a view to increasing the molecular weight of a novolak resin without degrading the excellent characteristic properties of the novolak resin, and as a result, we found a novolak resin having a heretofore unexpected high molecular weight and a high softening point, in which the dependency of the softening point on the molecular weight is reduced, and thus have completed the present invention.

SUMMARY OF THE INVENTION

More specifically, in accordance with the present invention, there is provided an organic solvent-soluble, high-molecular-weight novolak resin having an inherent viscosity of at least 0.1, which is obtained by reaction of a phenol composed mainly of a polyfunctional phenol with an aldehyde in the solution state in the presence of an acid catalyst.

BRIEF DESCRIPTION OF THE DRAWINGS

FIG. 1 illustrates the relationship between the softening temperature and the inherent viscosity, observed in novolak resins obtained in Examples 5 through 9. E5 through E9 indicate Examples 5 through 9, respectively.

DETAILED DESCRIPTION OF THE PREFERRED EMBODIMENTS

The present invention is concerned with a substantially linear, organic solvent-soluble, high-molecular-weight novolak resin having an inherent viscosity, defined below, of at least 0.1, preferably at least 0.15.

The inherent viscosity ($\eta$inh) is determined according to the following method.

To 110 g of dimethylsulfoxide, 0.4 g of concentrated sulfuric acid is added, and the solution is used as the solvent. The novolak resin is dissolved in the solvent at a concentration of 0.5 g/100 ml, and the inherent viscosity is calculated from the flow times of the solvent ($T_1$) and solution ($T_2$) measured at 30° C. by using a Cannon-Fenske type viscometer according to the following formula:

$$\eta\text{inh} = \frac{\ln \eta\text{rel}}{C}$$

wherein
$\eta\text{rel} = T_2/T_1$
$C$ = concentration (g/100 ml)

Although the inherent viscosity of the conventional novolak resin is about 0.08 at highest, the novolak resin of the present invention has an inherent viscosity of at least 0.1, and thus has a high molecular weight. Despite such a high molecular weight, the novolak resin of the present invention is characterized in that the novolak resin is soluble in polar organic solvents such as acetone, ethylene glycol monomethyl ether, dimethylacetamide, and dimethylsulfoxide, and aqueous solutions of inorganic and organic alkalis such as sodium hydroxide and tetramethyl ammonium hydroxide. Accordingly, it is understood that this high-molecular-weight novolak resin has a substantially linear structure.

By the term "organic solvent-soluble" used in the present invention, it is meant that the solubility of the high-molecular-weight novolak resin of the present invention in acetone at 25° C. is at least 95%, preferably at least 98%.

The solubility is determined according to the following method.

A 200-ml Erlenmeyer flask provided with a common plug is charged with about 1 g of a precisely weighed novolak resin (A), and 100 ml of acetone is added and the mixture is stirred for 30 minutes by a magnetic stirrer to dissolve the resin. The solution is naturally filtered by using a 1 G glass filter which was weighed preparatively (B). The glass filter is dried at 120° C. for 2 hours, naturally cooled in a desiccator, and weighed (C). The solubility is determined according to the following formula:

$$\text{Solubility (\%)} = \left(1 - \frac{C - B}{A}\right) \times 100$$

One prominent characteristic feature of the novolak resin of the present invention is that, although it is soluble, it has a softening temperature higher than that of the conventional novolak resin. The softening temperature of the novolak resin of the present invention rises in accordance with the increase of the inherent viscosity (that is, with the increase of the molecular weight), but if the inherent viscosity exceeds 0.1, the dependency of the softening temperature on the molecular weight is gradually reduced, and if the inherent viscosity exceeds 0.15, this dependency is further reduced. This means that a novolak resin having a certain softening temperature can be easily prepared.

The softening temperature (°C.) of the soluble high-molecular-weight novolak resin of the present invention is measured according to the following method.

A high-molecular-weight novolak resin is powdered and about 5 mg of the powder is inserted between two cover glass sheets (18 mm x 18 mm x about 0.2 mm) for a microscope, and placed on a hot plate in which the temperature-elevating rate can be controlled by a slide voltage regulator. The temperature is elevated while the novolak resin is subjected to a light pressure by pressing on the glass sheet with a small spatula of stainless steel. The median temperature between the temperature at which a part of the resin is softened and begins to become transparent and the temperature at which the entire resin is softened and becomes transparent is designated as the softening temperature. If the temperature-elevating rate in the vicinity of the softening temperature is set at about 15° C./min, the softening temperature can be measured with a good reproducibility.

The novolak resin having an inherent viscosity of at least 0.1 according to the present invention flows very little, even if it is heated without being subjected to a load, and when the logarithmic viscosity number is at least 0.15, the resin does not substantially flow. This peculiar property is an important property required for preventing the change of a pattern form when a fine pattern composed mainly of the novolak resin is heated. This property is not observed in conventional novolak resins.

When the novolak resin having an inherent viscosity of at least 0.1 according to the present invention is heated under compression, the resin shows a flowability and a good molded body can be prepared.

The high-molecular-weight soluble novolak resin of the present invention is prepared according to the following process.

More specifically, a polyfunctional phenol is heated together with an aldehyde in a solvent in the presence of an acidic catalyst with stirring, preferably in an inert atmosphere such as nitrogen, until the predetermined viscosity is attained, whereby a high-molecular-weight soluble novolak resin is obtained.

The polyfunctional phenol used in the present invention is a phenol having at least two active hydrogen atoms. For example, there are preferably used phenol and compounds represented by the formulae

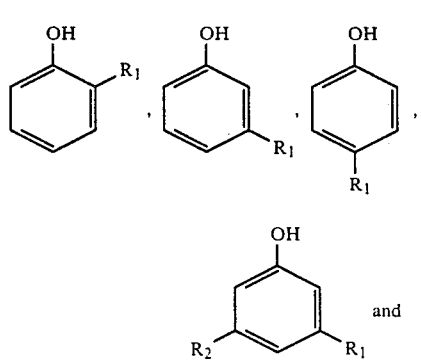

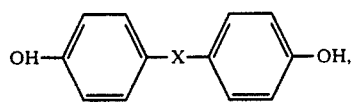

in which R₁ and R₂ represent an alkyl group having 1 to 10 carbon atoms, a phenyl group, a halogen atom or a hydroxyl group and R₁ and R₂ may be the same or different, and X represents —CH$_2$—, —C(CH$_3$)$_2$— or —O—.

Preferably, a polyfunctional phenol comprising at least 30 mole %, especially at least 50 mole %, of a trifunctional phenol having three active hydrogen atoms is used in the present invention. If necessary, the polyfunctional phenol may comprise a bifunctional phenol having two active hydrogen atoms.

The trifunctional phenol used preferably in the present invention is a phenol having three active hydrogen atoms on the benzene nucleus, and specifically, there can be mentioned phenol, a 3-substituted phenol, and a 3,5-di-substituted phenol. These trifunctional phenols are generally represented by the following general formula (I):

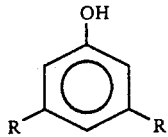
(I)

wherein the two R's independently represent a hydrogen atom, an alkyl group, a halogen atom or a hydroxyl group.

As specific examples, there can be mentioned phenol, meta-substituted phenols such as m-cresol, m-ethylphenol, m-propylphenol, m-isopropylphenol, m-butylphenol, m-amylphenol, m-hexylphenol, m-heptylphenol, m-octylphenol, m-fluorophenol, m-chlorophenol, m-bromophenol, and resorcinol, and 3,5-di-substituted phenols such as 3,5-xylenol, 3,5-diethylphenol, 3,5-diisopropylphenol, 3,5-dibutylphenol, 3,5-diamylphenol, 3,5-dihexylphenol, 3,5-dioctylphenol, 3,5-difluorophenol, 3,5-dichlorophenol, and 3,5-dibromophenol. These trifunctional phenols are especially preferred from the viewpoint of the reaction speed.

The bifunctional phenol used in the present invention is a phenol having two active hydrogen atoms on the benzene nucleus, and this bifunctional phenol is generally represented by the following general formula (II):

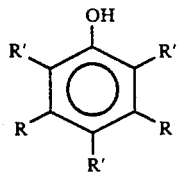
(II)

wherein two of the three R's represent a hydrogen atom and the remaining R' represents an alkyl group, a phenyl group or a halogen atom, and R represents a hydrogen atom, an alkyl group or a halogen atom, and R' and R may be the same or different.

More specifically, there can be mentioned ortho-substituted and para-substituted phenols. As specific examples of such ortho-substituted and para-substituted phenols, there can be mentioned alkylphenols such as cresol, ethylphenol, n-propylphenol, isopropylphenol, n-butylphenol, sec-butylphenol, tert-butylphenol, sec-amylphenol, tert-amylphenol, hexylphenol, and octylphenol; halophenols such as fluorophenol, chlorophenol, and bromophenol; and arylphenols such as phenylphenol and tolylphenol. Furthermore, there can be mentioned 2,3-xylenol, 3,4-xylenol, 2,5-xylenol, 2,3-diethylphenol, 3,4-diethylphenol, 2,5-diethylphenol, 2,3-diisopropylphenol, 3,4-diisopropylphenol, 2,5-diisopropylphenol, 2,3-dichlorophenol, 3,4-dichlorophenol, 2,5-dichlorophenol, 2-methyl-3-phenylphenol, 3-methyl-4-phenylphenol, and 2-methyl-5-phenylphenol.

These bifunctional phenols are appropriately selected and used for adjusting the water resistance, softening point, and compatibility of the formed novolak resin.

Furthermore, 4,4-dihydroxydiphenylmethane, 4,4'-dihydroxydiphenylpropane, 4,4'-dihydroxydiphenyl ether, hydroquinone, catechol, α-naphthol and β-naphthol can be used as the polyfunctional phenol.

An aldehyde represented by the following general formula (III):

$$R^2-CHO \qquad (III)$$

wherein R$^2$ represents a hydrogen atom, a methyl group or a halomethyl group, is ordinarily used as the aldehyde in the present invention. More specifically, there can be mentioned formaldehyde, acetaldehyde, monochloroacetaldehyde, dichloroacetaldehyde, and trichloroacetalhyde.

Formaldehyde is most preferred among these aldehydes, and formaldehyde is used in the form of formaldehyde, trioxane, tetraoxane or paraformaldehyde. Furthermore, a hemiacetal or acetal obtained by reacting an aldehyde with an alcohol can be used. In view of the solubility for the formed novolak resin, use of the aldehyde in the form of an aqueous solution is not preferred. Moreover, the aldehyde may be used in combination with an active aldehyde such as furfural.

In order to obtain the high-molecular-weight soluble novolak resin of the present invention, the molar ratio (F/P) of the aldehyde (F) to the polyfunctional phenol (P) must be in the range of from 0.85 to 1.20, preferably from 0.90 to 1.15. If the molar ratio is lower than 0.85, a high-molecular-weight novolak resin cannot be obtained and if the molar ratio is higher than 1.20, gelation is caused and a soluble novolak resin cannot be obtained. If a high-molecular-weight novolak resin having an inherent viscosity of at least 0.15 is desired, preferably the molar ratio is in the range of from 0.90 to 1.15.

Preferably, the optimum molar ratio is experimentally determined according to the intended inherent viscosity of the novolak resin and the reaction conditions adopted. This is because the reaction rate or the conversion of formaldehyde or a derivative thereof differs according to the kinds and amounts of the solvent and acid catalyst used, the concentration of the solution, the reaction temperature, and the kind of polyfunctional phenol.

In the present invention, the reaction must be carried out in the state of a homogeneous solution, except the initial stage for dissolving the starting materials.

In preparing a novolak resin by reacting an aqueous solution of a phenol and formaldehyde in the presence of an acid catalyst, in general, the reaction mixture becomes opaque midway through the reaction and the reaction mixture is separated into a resin layer and an aqueous layer.

If this separation of the novolak resin is caused midway through the reaction, the benzene ring on the terminal of the novolak resin is inhibited from reacting with formaldehyde, a methylol group or a derivative thereof, and a high-molecular-weight novolak resin is difficult to obtain.

A solvent not precipitating the formed novolak resin is used in the present invention. For example, there can be mentioned ethers such as dioxane and ethylene glycol dimethyl ether, alcohols such as ethyl alcohol, and propyl alcohol, and esters such as ethylene glycol monomethyl ether acetate. A more preferred solvent is a solvent having a good compatibility with a novolak type phenolic resin. For example, there can be mentioned monoalkyl and monoaryl ethers of polyhydric alcohols such as ethylene glycol monomethyl ether, ethylene glycol monoethyl ether, ethylene glycol monobutyl ether, ethylene glycol monophenyl ether, ethylene glycol benzyl ether, diethylene glycol monomethyl ether, diethylene glycol monoethyl ether, diethylene glycol monobutyl ether, propylene glycol monomethyl ether, propylene glycol monoethyl ether, dipropylene glycol monomethyl ether, and glycerol dimethyl ether, and aprotic polar solvents such as N,N'-dimethylformamide, N,N'-diethylformamide, N,N'-dimethylacetamide, N-methyl-2-pyrrolidone, dimethylsulfoxide, sulforane, tetraethylurea, and hexamethylphosphoamide. Moreover, a halogenated hydrocarbon, a nitro hydrocarbon, or an aromatic hydrocarbon may be added, so long as the dissolving property is not inhibited.

The solvent should be selected so that decomposition of the polyfunctional phenol, formaldehyde or a derivative thereof, the acid catalyst or the solvent does not occur, and the formation of a high-molecular-weight soluble novolak resin is not substantially inhibited.

The stability or usability of a solvent can be determined based on teachings of literature references and handbooks, but preferably, a small amount of the solvent is preliminarily tested by using a flask having a capacity of 50 to 100 ml.

As the acidic catalyst used in the present invention, there can be mentioned inorganic protonic acids such as perchloric acid, sulfuric acid, hydrochloric acid, phosphorous acid, phosphoric acid, pyrophosphoric acid, and polyphosphoric acid; organic protonic acids such as p-toluene-sulfonic acid, methanesulfonic acid, oxalic acid, maleic acid, trimellitic acid, formic acid, hydroxyacetic acid, acetic acid, propionic acid, and butyric acid; and Lewis acids such as boron trifluoride, a boron trifluoride complex, e.g., a boron trifluoride/ether complex, aluminum trichloride, tin tetrachloride, zinc chloride, ferric chloride, and titanium tetrachloride. Protonic acids are preferred among these acidic catalysts. When a weak acid such as acetic acid or propionic acid is used as the catalyst, as is expected from the empirical formula given hereinafter, in a considerably large amount of the weak acid should be used. In this case, since the weak acid such as acetic acid or propionic acid can also act as the solvent, the weak acid may be used instead of the above-mentioned solvent.

An appropriate acid catalyst is selected according to the intended softening point of the soluble high-molecular-weight novolak resin. Where a soluble high-molecular-weight phenolic resin having an inherent viscosity of at least 0.1, which is not softened, is desired, preferably a strong acid such as sulfuric acid or perchloric acid is used as the catalyst. Where a soluble high-molecular-weight novolak resin having a softening temperature of about 110° C. is desired, preferably a weak acid such as propionic acid is used as the acidic catalyst. In order to obtain a high-molecular-weight novolak resin having a medium softening temperature, preferably an acidic catalyst having a medium acidity is used. For example, when pyrophosphoric acid is used as the catalyst, a novolak resin having a softening temperature of 160 to 165° C. is obtained.

The amount of the acidic catalyst used differs according to the acidity of the catalyst used, the kind of the solvent used, and the concentration of the reaction solution. If the acidity of the catalyst is high or the concentration of the reaction solution is high, the amount of the acidic catalyst used can be reduced. When a aprotic polar solvent which is strongly solvated with a cation, such as dimethylsulfoxide or N-methyl-2-pyrrolidone, is used, the amount of the acidic catalyst used should be increased, compared with the amount of the acidic catalyst used when a solvent not so strongly solvated with a cation, such as ethylene glycol monomethyl ether, is used.

When the reaction is carried out at a concentration of 60% and a solution temperature of 120° C. for about 10 hours by using an ordinary solvent such as ethylene glycol monomethyl ether, the amount of the acidic catalyst per mole of the phenol used can be estimated by the following empirical formula:

$$\text{Amount (moles) of acidic catalyst} = 4.2 \times 10^{-3}/\sqrt{Ka}$$

wherein Ka represents the dissociation constant of the acidic catalyst in an aqueous solution at 25° C.

The amount of the catalyst to be used can be easily determined by carrying out experiments using the catalyst in an amount estimated from the above empirical formula. For example, where polymerization is carried out by using acetic acid, which is a weak acid having a Ka value of $1.77 \times 10^{-5}$ mole/l, as the acidic catalyst, a soluble high-molecular-weight novolak resin can be obtained if acetic acid is used in an amount of 50 to 150 mole % based on the phenol.

Where the reaction is carried out under conditions such that the molar ratio (F/P) of the aldehyde to the polyfunctional phenol is about 1.0, as in the present invention, especially when formaldehyde is used as the aldehyde, a phenomenon is observed in which unreacted formaldehyde is deposited in the form of a white solid on a low-temperature portion of the reaction system during the reaction. This white solid has a strong formaldehyde smell, and if a hot reaction solution is poured onto the white solid, it is immediately dissolved. Accordingly, it is considered that the white solid is low-molecular-weight polymethylene glycol formed by condensation of the formaldehyde. The amount of the white solid deposited is greatly changed according to the temperature-elevating rate or the amount of the reactant. The occurrence of this phenomenon results in a large error of the set value of the F/P molar ratio, and the reproducibility of the reaction is lost, with the result that control of the inherent viscosity of the formed soluble high-molecular-weight novolak resin becomes impossible.

This problem may be solved according to a method in which the amount of the acidic catalyst is reduced whereby the reaction is gradually started, and, when the majority of the starting material is reacted, the reaction mixture is cooled and the acidic catalyst is further added. This method, however, is complicated, and is disadvantageous from the economical viewpoint.

A most preferred method is that in which an alcohol or thioalcohol is added to the reaction mixture. The alcohol reacts with the aldehyde to form a hemiacetal or acetal. Ordinarily, the hemiacetal or acetal is liquid under the reaction conditions, and even if the hemiacetal or acetal is condensed by a cooling portion of the reaction system, for example, a reflux cooler, it is returned to the reaction mixture, and the molar F/P ratio at the time of charging is not changed. Accordingly, the reproducibility of the reaction is highly improved.

Although the hemiacetal or acetal has an inferior reactivity to the original aldehyde, in the presence of the acidic catalyst the hemiacetal or acetal can react with the phenol sufficiently. Moreover, by utilizing this reduction of the reactivity, the concentration of the solution can be increased at the start of the reaction and the productivity can be improved. Moreover, since the steric hindrance of the hemiacetal or acetal is larger than that of the original aldehyde, the selectivity of the reaction is improved and attainment of an effect of preventing branching or crosslinking (gelation) of the formed soluble high-molecular-weight novolak resin is expected.

The alcohol used for the above-mentioned purpose is preferably an alcohol which is a good solvent for the formed novolak resin. For example, there can be mentioned aliphatic monoalcohols such as ethyl alcohol, propyl alcohol, and butyl alcohol; alkyl and aryl ethers of polyhydric alcohols such as ethylene glycol monomethyl ether, ethylene glycol monoethyl ether, ethylene glycol monobutyl ether, ethylene glycol monophenyl ether, ethylene glycol benzyl ether, diethylene glycol monomethyl ether, diethylene glycol monoethyl ether, diethylene glycol monobutyl ether, propylene glycol monoethyl ether, propylene glycol monomethyl ether, dipropylene glycol monomethyl ether, and glycerol dimethyl ether; hydroxycarboxylic acids such as mandelic acid, malic acid, and glycolic acid; thioalcohols such as butylmercaptan, isobutylmercaptan, n-amylmercaptan, and n-hexylmercaptan; and mercaptocarboxylic acids such as mercaptoacetic acid and 2-mercaptopropionic acid. These compounds may be used singly or in the form of mixtures of two or more thereof.

The amount of the alcohol or thioalcohol used is changed according to the reaction conditions, but ordinarily it is sufficient if the alcohol or thioalcohol is used in an amount of at least 0.3 mole, preferably at least 0.5 mole, per mole of the aldehyde present in the reaction mixture. If the amount of the alcohol or thioalcohol is smaller than 0.3 mole per mole of the aldehyde, a white solid is sometimes precipitated on the cooling portion unless the reaction is carefully carried out.

Where a compound having a hydroxyl group or a mercapto group is used as the solvent, the alcohol or thioalcohol as mentioned above need not be particularly added, but an alcohol or thioalcohol having a structure different from that of the solvent may be added according to need.

The reaction is carried out at a concentration of 10 to 80% by weight, preferably 20 to 60% by weight, as the concentration of the sum of the charged polyfunctional phenol and aldehyde. If the concentration is higher than 80% by weight, the generation of heat is extreme at the initial stage of the reaction and stirring is difficult at the latter stage of the reaction. If the concentration is lower than 10% by weight, the reaction rate is reduced and, therefore, it is necessary to use the acidic catalyst in a large amount, resulting in an increase of the manufacturing cost.

The soluble high-molecular-weight novolak resin of the present invention can be obtained by reacting the polyfunctional phenol with the aldehyde under heating in the solvent in the presence of the acidic catalyst. When paraformaldehyde is used as the aldehyde, the paraformaldehyde is powdery or flaky at normal temperature and is only slightly soluble in the solvent, and if the temperature is elevated with stirring, the paraformaldehyde is decomposed by the acidic catalyst and is dissolved in the solvent to form a homogeneous transparent solution. Ordinarily, the temperature at which this transparent solution is obtained is not higher than 90° C., although the temperature differs to some extent according to the kind of acidic catalyst used. The reaction mixture is maintained for about 30 minutes at a temperature at which a homogeneous solution is obtainable in the presence of the alcohol, and then the temperature is elevated to the reaction temperature. By this method, the occurrence of a violent reaction or deposition of formaldehyde onto the cooling portion can be prevented.

The reaction is carried out at a temperature ranging from 90° C. to the boiling point of the solvent. If necessary, the reaction temperature may be elevated to about 180° C. by carrying out the reaction under pressure. To prevent the occurrence of side reactions, it is generally preferred that the reaction be carried out at about 90 to about 120° C. The reaction pressure is 1 to 20 kg/cm$^2$-G, preferably 1 to 5 kg/cm$^2$-G.

In order to prevent coloration by oxidation of the polyfunctional phenol, preferably the reaction is carried out under heating with stirring in an atmosphere of an inert gas such as nitrogen or helium. If the reaction is carried out under the flow of such an inert gas, the volatile aldehyde or the polyfunctional phenol is carried away outside the reaction system by the inert gas. Accordingly, flow of the inert gas is not preferred.

The thus-obtained high-molecular-weight novolak resin of the present invention can be used as a resin component of a radiation-sensitive resist. More specifically, when the novolak resin of the present invention is combined with a dissolution inhibitor such as naphthoquinone diazide or a poly(olefin-sulfone), a positive type radiation-sensitive resist can be obtained, and if the novolak resin of the present invention is combined with a crosslinking agent such as an azide compound, a negative type radiation-sensitive resist can be obtained. These resists formed by using the high-molecular-weight novolak resin of the present invention have a high sensitivity to radiations such as UV light, deep UV light, electron beams, X-rays, and ion beams and have a high plasma etching resistance and a high heat resistance. Namely, in these resists, image distortion is not caused by heat generated during plasma etching.

A high-molecular-weight novolak resin having an inherent viscosity of at least 0.1, preferably at least 0.15, is used as the resin component for the production of the radiation-sensitive resist of the present invention, and this high-molecular-weight novolak resin may be mixed with a novolak resin having an inherent viscosity smaller than 0.1, prepared according to the known process, or an alkali-soluble resin such as poly(p-hydroxystyrene). Preferably, the inherent viscosity of the thus-obtained resin composition is at least 0.1, especially at least 0.15.

Preferably, a 1,2-naphthoquinonediazidosulfonic acid ester is used as the dissolution inhibitor for the production of a positive type radiation-sensitive resist. This ester is obtained by reacting 1,2-naphthoquinonediazido-4-sulfonic acid chloride or 1,2-naphthoquinonediazido-5-sulfonic acid chloride with a polyhydroxybenzene such as pyrogallol or a polyhydroxyphenylarylketone such as 2,3,4-trihydroxybenzophenone. For example, there can be mentioned 1,2-naphthoquinonediazidosulfonic acid esters disclosed in U S. Pat. Nos. 2,797,213, 3,106,465, 3,148,983, 3,646,118, and 3,785,825, J. Kosar, Light-Sensitive Systems, John Wiley & Sons, Inc., New York, 1965, PP. 339-352 and W. S. DeFrost, Photoresist, McGraw-Hill, Inc., New York, 1975, P. 50.

The 1,2-naphthoquinonediazidosulfonic acid ester is used in an amount of 5 to 100 parts by weight, preferably 10 to 50 parts by weight, per 100 parts by weight of the high-molecular-weight novolak resin of the present invention. If the amount of the ester is smaller than 5 parts by weight, the dissolution-inhibiting effect on the alkali-soluble high-molecular-weight novolak resin is insufficient, and if the amount of the ester is larger than 100 parts by weight, the sensitivity is reduced.

As the crosslinking agent for the production of a negative type radiation-sensitive resist, there are preferably used diazide compounds such as 3,3'-diazidodiphenylsulfone and 4,4'-diazidodiphenylmethane and monoazide compounds such as 4-azidobenzal-4-methoxyacetophenone, and 4-azidobenbenzal-2'-methoxyacetophenone. The azide compound is used in an amount of 3 to 50 parts by weight, preferably 5 to 30 parts by weight, per 100 parts by weight of the high-molecular-weight-novolak resin of the present invention.

A positive type radiation-sensitive resist can be prepared by dissolving the high-molecular-weight novolak resin of the present invention and the 1,2-naphthoquinonediazidosulfonic acid ester in a solvent. As the solvent, there can be used glycol ethers such as ethylene glycol monomethyl ether, ethylene glycol monoethyl ether, propylene glycol monomethyl ether, and propylene glycol monoethyl ether; esters such as acetic acid esters, e.g., acetic acid esters of the above-mentioned glycol ethers, ethyl acetate and butyl acetate; and ketones such as cyclohexanone. These solvents may be used singly or in the form of mixtures of two or more thereof. The solvent may be mixed with an aromatic hydrocarbon such as toluene or xylene, according to need.

The concentration of the thus-obtained radiation-sensitive resist is determined according to the coating conditions and the intended film thickness, but in general, the resist is used in the form of a solution having a concentration of 5 to 50% by weight, preferably 10 to 35% by weight.

Dye additives for preventing halation from the substrate, such as Methyl Violet, Crystal Violet, Marachite Green, Victoria Blue B or Neutral Red may be added to the radiation-sensitive resist in an amount of about 1 to about 10% by weight based on the solids.

Moreover, additives such as anti-striation agents, adhesion promotors, a non-ionic surface active agents, sensitizers, and plasticizers may be added. These additives are added in amounts of up to 5% by weight based on the solids. For example, ordinary additives as disclosed in U.S. Patent No. 4,550,069 are appropriately selected.

The radiation-sensitive resist obtained by using the soluble high-molecular-weight novolak resin of the present invention is valuable as an etching protecting resist for the production of articles for which high-precision processing is required, such as a copper-lined laminate for a printed circuit board, a transistor, and an integrated circuit. Moreover, this resist can be used for the production of an offset printing plate.

The present invention will now be described in detail with reference to the following examples, that by no means limit the scope of the invention.

EXAMPLE 1

A 1-liter three-neck flask equipped with a mechanical stirrer, a thermometer, a reflux condenser, an inlet tube for the introduction of nitrogen and an outlet tube was charged with 42.43 g of paraformaldehyde having a purity of 93.0%, 122.72 g of phenol purified by distillation (F/P=1.008), 74.96 g of 85% phosphoric acid and 292.63 g of ethylene glycol monomethyl ether and the atmosphere was substituted with nitrogen. The mixture was heated with stirring at a bath temperature of 70° C. for 30 minutes. The reaction was then conducted at 120° C. for 6 hours. Then the reaction mixture was cooled to stop the reaction.

The resulting clean, colorless and viscous novolak resin solution was diluted to a concentration of 15%, and the solution was poured into water which was agitated vigorously in a high speed mixer to separate the novolak resin. The separated novolak resin was sufficiently washed with an aqueous solution of sodium hydrogen-carbonate and with pure water, filtered and then dried in a vacuum oven at 50° C. for 24 hours.

The obtained high-molecular-weight novolak resin was completely dissolved in acetone at 25° C. The inherent viscosity, the softening temperature, and the average molecular weight and molecular weight distribution according to the GPC-LALLS method using a gel permeation chromatography (GPC) and a low angle laser light scattering detector (LALLS) in combination, were determined with respect to the obtained soluble high-molecular-weight novolak resin. The obtained results are shown in Table 1. The measurement conditions adopted are as follows.

(A) GPC Measurement Conditions

Apparatus
GPC Model 201D (supplied by Waters Co.)
Detector: differential deflection detector
Model R-401 (supplied by Waters Co.)
Separating column: two columns, TSK-GEL-GMH
(supplied by Toyo Soda Mfg. Co., Ltd.)
Eluting solution: THF
Flow rate: 1 ml/min
Temperature: 23° C.
Sample
Solution of novolak resin of 0.2% concentration
in THF (completely dissolved).
Amount introduced: 0.5 ml

(B) LALLS Measurement Conditions

Apparatus
Low angle laser light scattering detector
Model GMX-100 (supplied by Chromatix Co.)
Conditions
Wavelength: 633 nm (He—Ne)
Second virial coefficient (A): neglected
because of low concentration
Refractive index concentration change (dn/dc):
0.202 ml/g
[determined from the difference ΔC of the
refractive index between the sample solution
in THF at a variable concentration and the
solvent, measured at a wavelength of 633 nm
(He—Ne) and a temperature of 23° C. by using a
laser differential refractive index meter
(Model KMX-16 supplied by Chromatix Co.)]

TABLE 1

| Item | Result |
| --- | --- |
| Reaction time (hours) | 6.0 |
| Inherent viscosity | 0.165 |
| Solubility in acetone (%) | 100 |
| Softening temperature (°C.) | 155 |
| Number average molecular weight (Mn) | 19,600 |
| Dispersion (Mw/Mn) | 5.14 |

EXAMPLES 2 THROUGH 4

To 60.34 g of acetic acid as the catalyst and 24.89 g of ethylene glycol monomethyl ether as the solvent, 32.68 g of paraformaldehyde having a purity of 93.0% and 95.18 g of phenol purified by distillation (F/P=1.001) were added, and the atmosphere was substituted with nitrogen. With stirring, the mixture was immersed in an oil bath at 70° C. under slight compression by nitrogen without flowing to initiate heating. The bath temperature was elevated to 120° C. over a period of 1.5 hours and the reaction was continued. The viscosity was gradually increased. Sampling was effected midway through the reaction. After the passage of 11.5 hours, the reaction mixture was cooled. The properties of the novolak resin separated and dried in the same manner as described in Example 1 are shown in Table 2.

TABLE 2

| Example No. | Reaction time (hours) | Inherent viscosity | Solubility in acetone (%) | Softening temperature (°C.) |
| --- | --- | --- | --- | --- |
| 2 | 10 | 0.110 | 100 | 112.5 |
| 3 | 11 | 0.188 | 100 | Not measured |
| 4 | 11.5 | 0.522 | 99 | 132.5 |

EXAMPLES 5 THROUGH 9

The reaction was carried out by using various acidic catalysts. The conditions for obtaining a soluble high-molecular-weight novolak resin were changed according to the acidity of the acidic catalyst. The conditions for obtaining an intended novolak resin within an appropriate time are shown in Table 3.

The formed novolak resin was separated and dried in the same manner as described in Example 1. The novolak resin was completely dissolved in acetone at 25° C. The results of the measurement of the softening temperature and inherent viscosity of the novolak resin obtained in each example is shown in FIG. 1.

TABLE 3

| Example No. | Acidic catalyst Kind | Amount* | Concentration of polymerization solution (%) |
| --- | --- | --- | --- |
| 5 | Propionic acid | 0.13–0.87 | 60–70 |
| 6 | Maleic acid | 0.3–0.35 | 30–40 |
| 7 | Pyruvic acid | 0.4 | 50 |
| 8 | 116% polyphosphoric acid | 0.03–0.3 | 40–60 |
| 9 | Pyrophosphoric acid | 0.3–0.6 | 30 |

Note *molar ratio to paraformaldehyde

EXAMPLE 10

A solution was formed by adding 22.99 g of concentrated sulfuric acid to 35.68 g of propylene glycol monomethyl ether and 112.86 g of N-methylpyrrolidone under cooling, and 14.69 g of paraformaldehyde and 42.48 g of phenol (F/P=1.008) were added to the solution. The mixture was reacted under heating in the same manner as described in Example 1. A high-viscosity solution was obtained when the reaction was conducted for 4.5 hours. In the same manner as described in Example 1, the high-molecular-weight novolak resin was separated and dried. The inherent viscosity of the obtained white powder was 0.566 and the powder had a solubility of 99% in acetone at 25° C. Even if the resin was heated to a temperature higher than 200° C., the resin did not soften or flow, and when the temperature was further elevated, the resin was carbonized but retained its shape.

EXAMPLE 11

Under ice cooling, 14.69 g of paraformaldehyde, 42.48 g of phenol (F/P=1.008), 22.99 g of concentrated sulfuric acid, 35.68 g of ethylene glycol monomethyl ether and 112.8 g of N-methylpyrrolidone were mixed, and the reaction was carried out in the same manner as described in Example 1. On initiation of the reaction, heat was generated. A high-viscosity solution was obtained when the reaction was conducted for 4 hours. The inherent viscosity of the white powder obtained by conducting the treatment in the same manner as described in Example 1 was 0.520, and even if the powder was heated to 300° C., the powder did not soften or flow but was discolored while retaining its shape. The powder had a solubility of 99% in acetone at 25° C.

EXAMPLE 12

In a mixture of 32.53 g of sulfuric acid, 48.50 g of diethylene glycol monomethyl ether and 156.39 g of N-methylpyrrolidone, 19.15 g of trioxane was reacted with 60.00 g of phenol (F/P=1.000). When the temperature was gradually elevated from 70° C. and the reaction was carried out at a bath temperature of 135° C., a violent exothermic reaction was caused at the initial stage. In this state, the reaction was conducted for 3 hours. Then the soluble high-molecular-weight novolak resin which had a solubility of 100% in acetone at 25° C., an inherent viscosity of 0.200, and a softening temperature of 124° C. was obtained.

EXAMPLE 13

Under a nitrogen atmosphere, 245.38 g of paraformaldehyde, 714.62 g of phenol (F/P=1.001), 8.67 g of 85% phosphoric acid, 57.83 g of ethylene glycol monomethyl ether, and 86.75 g of N-methylpyrrolidone were mixed under cooling. The temperature was gradually elevated from 70° C. and the mixture was stirred. When the inner temperature was elevated to about 95° C., the reaction solution became homogeneous and transparent. The temperature was elevated to 120° C. over a period of 3 hours, and the reaction was conducted at this temperature for 3 hours.

A glass autoclave was charged with 233.77 g of the reaction mixture and 486.23 g of N-methylpyrrolidone, and the temperature was elevated from normal temperature, and the reaction was carried out at 170° C. for 6 hours and at 180° C. for 1 hour to obtain a high-viscosity solution having a dense reddish violet color. The pressure in the glass autoclave was 2.6 to 3.0 kg/cm². The inherent viscosity of the obtained soluble novolak resin was 0.326 and the softening temperature was 155° C. The solubility of the novolak resin in acetone at 25° C. was 100%.

EXAMPLE 14

In the same manner as described in Example 1, 39.17 g of paraformaldehyde, 114.07 g of phenol (F/P=1.001), 13.85 g of phosphoric acid, 27.88 g of isopropyl alcohol, and 83.65 g of dimethylsulfoxide were reacted for 9 hours to obtain a soluble novolak resin having an inherent viscosity of 0.433. The softening temperature was 145° C. and the solubility in acetone at 25° C. was 99%.

EXAMPLES 15 THROUGH 18

The reaction was carried out in the same manner as described in Example 14 except that the kind of alcohol and the amount and concentration of the phosphoric acid catalyst were changed, whereby a soluble high-molecular-weight novolak resin shown in Table 4 was obtained. The novolak resin obtained in each example was completely dissolved in acetone at 25° C. The ratio by weight of alcohol/dimethylsulfoxide used for this reaction was ¼.

EXAMPLES 19 THROUGH 22 AND COMPARATIVE EXAMPLES 1 THROUGH 4

Commercially available low-molecular-weight novolak resins and high-molecular-weight novolak resins of the present invention were press-molded. Namely, molded plates 80 mm×80 mm×3 mm were prepared by using novolak resins alone or in combination with 10% of hexamethylene-tetramine. In case of the soluble high-molecular-weight novolak resins of the present invention, semi-transparent strong molded plates were obtained when the resins were used alone or in combination with hexamethylene-tetramine. On the other hand, a molded plate could not be obtained from the novolak resin having an inherent viscosity smaller than 0.1.

The soluble novolak resins are shown in Table 5, and the molding conditions and molding results are shown in Table 6.

TABLE 5

| Sample | Acid catalyst | Solubility in acetone (%) | Inherent viscosity | Softening temperature (°C.) |
|---|---|---|---|---|
| A | Sulfuric acid | 98 | 0.566 | Not softened |
| B | Polyphosphoric acid | 99.5 | 0.625 | 152 |
| C[1] | Hydrochloric acid | 100 | 0.086 | 107 |
| D[2] | — | 100 | 0.085 | 93 |

Note
[1] According to the method disclosed in "Polymer Experiments, Volume 5, Polycondensation and Polyaddition", page 452 (1980), compiled by Shu Kanbara and published by Kyoritus Shuppan, the reaction was carried out, and the obtained novolak resin was dissolved in dimethylsulfoxide, then insoluble solids were removed by filtration. The solution was poured into water, and the mixture was gently stirred to solidify and separate the novolak resin, and the novolak resin was washed with water and dried under a reduced pressure.
[2] Commercial available "Varcum" TD-2090 (supplied by Dainippon Ink & Chemicals, Inc.) having a number average molecular weight of 850 (measured by the manufacturer) and an inherent viscosity of 0.085.

TABLE 4

| Example No. | Alcohol | Amount of phospho-acid catalyst | Concentration (%) of solution | Reaction time (hours) | Inherent viscosity | Softening temperature (°C.) |
|---|---|---|---|---|---|---|
| 15 | Hydroxyacetic acid | 0.03 | 55 | 4.0 | 0.129 | 135 |
| 16 | Cyclohexanol | 0.05 | 60 | 8.0 | 0.294 | 144 |
| 17 | 2-Ethylhexanol | 0.05 | 60 | 8.0 | 0.129 | 138 |
| 18 | Octanethiol | 0.05 | 60 | 15.0 | 0.326 | 145 |

TABLE 6

| | Sample | Amount of hexamethylene-tetramine (%) | Pressing conditions Temperature (°C.) | Pressure (kg) | Time (min) | Molding results |
|---|---|---|---|---|---|---|
| Example 19 | A | 0 | 170 | 50 | 10 | Dense brown transparent plate |
| Example 20 | B | 0 | 220 | 25 | 2 | |
| Example 21 | A | 10 | 170 | 70 | 10 | Hard tough brown plate |
| Example 22 | B | 10 | 220 | 70 | 10 | Hard semi-transparent tough brown plate |
| Comparative Example 1 | C | 10 | 100 | 70 | 2 | Very brittle thin plate flowing out from mold* |
| Comparative Example 2 | D | 10 | 100 | 70 | 2 | |
| Comparative Example 3 | C | 0 | 100 | 70 | 2 | Very brittle thin plate flowing out from mold |
| Comparative | D | 0 | 100 | 70 | 2 | |

TABLE 6-continued

| Sample | Amount of hexamethylene-tetramine (%) | Pressing conditions | | | Molding results |
|---|---|---|---|---|---|
| | | Temperature (°C.) | Pressure (kg) | Time (min) | |
| Example 4 | | | | | |

Note *When the resin was cured in a furnace at 150° C., the resin was melted and then foamed and solidified.

EXAMPLES 23 THROUGH 25

To 50.00 g of m-cresol, 15.09 g of parafolmaldehyde (F/P=1.011) and 28.05 g of acetic acid, ethylene glycol monoethyl ether was added to form a 60% solution. The solution was stirred at 70° C. for 30 minutes, at 90° C. for 30 minutes, and at 100° C. for 30 minutes and the reaction was carried out at 120° C. The solution viscosity was extremely elevated and stirring became difficult. Accordingly, the solution was diluted to 41.8% at the point of 2.6 hours, to 35.8% at the point of 4 hours, and to 30.5% at the point of 5 hours. The reaction mixture was cooled after the passage of 6 hours. The properties of the obtained high-molecular-weight novolak resin are shown in Table 7.

TABLE 7

| Example No. | Reaction time (hours) | Inherent viscosity | Solubility in acetone (%) | Softening temperature (°C.) |
|---|---|---|---|---|
| 23 | 2.6 | 0.360 | 100 | 168 |
| 24 | 4.0 | 0.462 | 100 | 169 |
| 25 | 6.0 | 0.494 | 100 | 169 |

EXAMPLES 26 THROUGH 29

To a mixture of 25.51 g of o-cresol and 25.25 g of p-cresol which were purified by distillation, and 15.09 g of paraformaldehyde (F/P=0.996), a solution of 125.33 g of ethylene glycol monomethyl ether and 28.32 g of concentrated sulfuric acid was added under cooling. The atmosphere was substituted with nitrogen, the mixture was heated at 70° C. for 30 minutes with stirring, and the reaction was carried out at 80° C. At the point of about 4 hours, the viscosity began to rise. At the point of 7.5 hours, ethylene glycol monomethyl ether was added to adjust the concentration to 25.4%. Since the viscosity became very high, the solution was diluted to 21.6% at the point of 11 hours, to 20.0% at the point of 15 hours, and to 18.5% at the point of 19 hours. After the passage of 25 hours, the reaction solution was cooled.

The formed high-molecular-weight novolak resin was separated in the same manner as described in Example 1. The properties of the obtained novolak resin are shown in Table 8.

TABLE 8

| Example No. | Reaction time (hours) | Inherent viscosity | Solubility in acetone (%) | Softening temperature (°C.) |
|---|---|---|---|---|
| 26 | 8 | 0.519 | 99 | 172 |
| 27 | 11 | 0.687 | 99 | 174 |
| 28 | 19 | 0.946 | 98 | 175 |
| 29 | 25 | 1.013 | 98 | 174 |

EXAMPLE 30

In 300 parts by weight of propylene glycol monomethyl ether acetate, 100 parts by weight of the high-molecular-weight m-cresol novolak resin obtained in Example 23, 24, or 25, and 25 parts by weight of 2,3-dihydroxy-4-(1,2-naphthoquinonediazido-5-sulfonyl)-benzophenone were dissolved. Thus, three kinds of positive type photoresist solutions of the novolak resins differing in inherent viscosity were prepared.

Each photoresist solution was coated on a silicon substrate by a spinner and then pre-baked on a hot plate at 105° C. for 90 seconds to obtain a photoresist film having a thickness of 1.2 μm. The photoresist film was irradiated through a test pattern mask for 0.7 seconds with rays from a 500 W high-pressure mercury lamp. Then, development was carried out with an aqueous solution of tetramethyl ammonium hydroxide. In each case, repeated positive patterns of 0.9 μm having an accurate shape were obtained with a high precision.

When each resist film was placed in an air oven and post-baked at 180° C. for 20 minutes, no deformation of the pattern was observed.

The post-baked resist film was placed in a RIE apparatus and was etched with carbon tetrafluoride/oxygen (95/5 volume ratio) at a power output of 100 W and a gas pressure of 15 Pa. When the pattern was observed by SEM (scanning electron microscopy), it was found that the pattern was not deformed and the resist film had a good heat resistance.

EXAMPLE 31

88 parts by weight of the cresol novolak resin having an inherent viscosity of 0.519, which was obtained in Example 26 and 12 parts by weight of poly(2-methylpentene-1-sulfone) were dissolved in isoamyl acetate. The solution was filtered through a membrane filter having a pore size of 0.2 μm to obtain a resist solution having a sensitivity to electron beams, X-rays, and ion beams. The resist high solution was coated on a silicon substrate having a silicon oxide layer by a spinner to form a resist film having a thickness of 1.3 μm. The film was exposed to light by an electron beam light exposure device having an acceleration voltage of 20 KV and was subjected to development treatment with an aqueous solution of tetramethyl ammonium hydroxide to obtain a positive type resist film having a desired pattern. When the heat resistance was tested in the same manner as described in Example 30, the pattern was not changed in any way.

I claim:

1. An organic solvent-soluble, high-molecular-weight novolak resin having an inherent viscosity of at least 0.1, which is obtained by reacting a polyfunctional phenol with an aldehyde, said polyfunctional phenol being at least one member selected from the group consisting of phenol and compounds represented by the formulae:

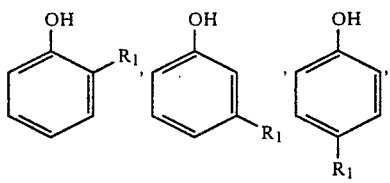

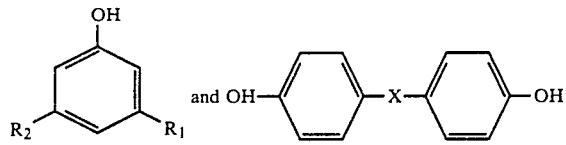

in which R₁ and R₂ independently represent an alkyl group having 1 to 10 carbon atoms, a phenyl group, a halogen atom or a hydroxyl group, and X represents —CH$_2$—, —C(CH$_3$)$_2$— or —O—, and at least 30% by mole of the polyfunctional phenol having a functionality of at least 3; and said novolak resin having a solubility in acetone of at least 95% at 25° C.

2. A radiation-sensitive resist which comprises as the resin component an organic solvent-soluble, high-molecular-weight novolak resin having an inherent viscosity of at least 0.1, wherein said novolak resin is obtained by reacting a polyfunctional phenol with an aldehyde, said polyfunctional phenol being at least one member selected from the group consisting of phenol and compounds represented by the formulae:

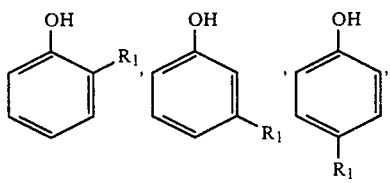

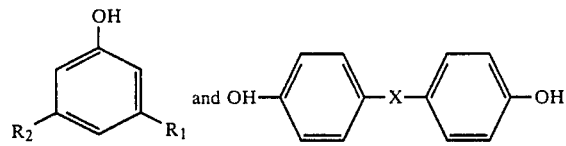

in which R₁ and R₂ independently represent an alkyl group having 1 to 10 carbon atoms, a phenyl group, a halogen atom or a hydroxyl group, and X represents —CH$_2$—, —C(CH$_3$)$_2$— or —O—, and at least 30% by mole of the polyfunctional phenol having a functionality of at least 3; and said novolak resin having a solubility in acetone of at least 95% at 25° C.

3. A high-molecular-weight novolak resin according to claim 1, wherein the inherent viscosity is at least 0.15.

4. A high-molecular-weight novolak resin according to claim 1, wherein the molar ratio of the aldehyde to the polyfunctional phenol is within the range of from 0.85 to 1.20

5. A high-molecular-weight novolak resin according to claim 1, wherein the polyfunctional phenol comprises at least 50 mole % of a phenol having a functionality of at least 3.

6. A high-molecular-weight novolak resin according to claim 1, wherein the polyfunctional phenol is at least one member selected from the group consisting of phenol, compounds represented by the formulae

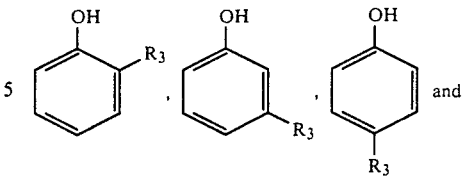

in which R₃ and R₄ independently represent an alkyl group having 1 to 3 carbon atoms, and resorcinol.

7. A high-molecular-weight novolak resin according to claim 6, wherein the polyfunctional phenol is at least one member selected from the group consisting of phenol, o-cresol, m-cresol, p-cresol and 3,5-xylenol.

8. A high-molecular-weight novolak resin according to claim 1, wherein the aldehyde is at least one member selected from the group consisting of formaldehyde, trioxane, tetraoxane and paraformaldehyde.

9. A process for the preparation of an organic solvent-soluble, high-molecular-weight novolak resin having an inherent viscosity of at least 0.1, which comprises reacting a polyfunctional phenol with an aldehyde at an aldehyde/polyfunctional phenol molar ratio of from 0.85 to 1.20 in the presence of an acidic catalyst in a solution state, wherein the polyfunctional phenol comprises at least 3 mole % of a phenol having a functional of at least 3.

10. A process for the preparation of a high-molecular-weight novolak resin according to claim 9, wherein the molar ratio of the aldehyde to the polyfunctional phenol is in the range of from 0.90 to 1.15.

11. A process for the preparation of a high-molecular-weight novolak resin according to claim 9, wherein the polyfunctional phenol is at least one member selected from the group consisting of phenol and compounds represented by the formulae

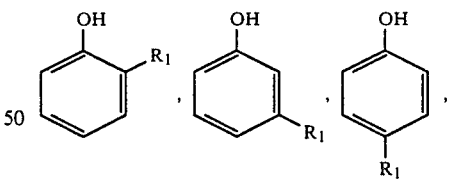

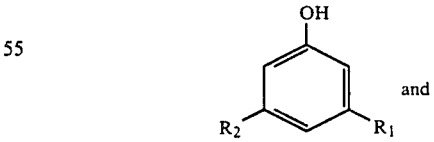

in which R₁ and R₂ independently represent an alkyl group having 1 to 10 carbon atoms, a phenyl group, a halogen atom or a hydroxyl group, and X represents —CH$_2$—, —C(CH$_3$)$_2$— or —O—.

12. A process for the preparation of a high-molecular-weight novolak resin according to claim 9, wherein the polyfunctional phenol comprises at least 50 mole % of a phenol having a functionality of at least 3.

13. A process for the preparation of a high-molecular-weight novolak resin according to claim 11, wherein the polyfunctional phenol is at least one member selected from the group consisting of phenol, compound represented by the formulae

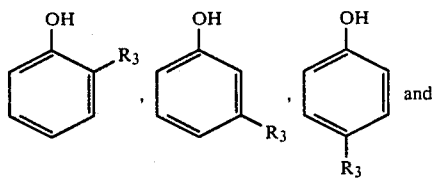

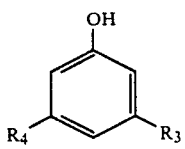

in which $R_3$ and $R_4$ independently represent an alkyl group having 1 to 3 carbon atoms, and resorcinol.

14. A process for the preparation of a high-molecular-weight novolak resin according to claim 12, wherein the polyfunctional phenol is at least one member selected from the group consisting of phenol, o-cresol, m-cresol, p-cresol and 3,5-xylenol.

15. A process for the preparation of a high-molecular-weight novolak resin according to claim 13 wherein the aldehyde is at least one member selected from the group consisting of formaldehyde, trioxane, tetraoxane and paraformaldehyde.

16. A process for the preparation of a high-molecular-weight novolak resin according to claim 9, wherein the acidic catalyst is a protonic acid.

17. A process for the preparation of a high-molecular-weight novolak resin according to claim 1, wherein the reaction is proceeded in the presence of an alcohol or thioalcohol having 2 to 20 carbon atoms in an amount of at least 0.3 mole per mole of the aldehyde.

18. A process for the preparation of a high-molecular-weight novolak resin according to claim 17, wherein the alcohol is at least one member selected from the group consisting of aliphatic monohydric alcohols, alkyl and aryl ethers of polyhydric alcohols and hydroxycarboxylic acids.

19. A high-molecular-weight novolak resin according to claim 1, wherein the molar ratio of the aldehyde to the polyfunctional phenol is within the range of from 0.90 to 1.15.

20. A high-molecular-weight novolak resin according to claim 3, wherein the molar ratio of the aldehyde to the polyfunctional phenol is within the range of from 0.85 to 1.20.

21. A high-molecular-weight novolak resin according to claim 9, wherein the aldehyde is at least one member selected from the group consisting of formaldehyde, trioxane, tetraoxane and paraformaldehyde.

22. A high-molecular-weight novolak resin according to claim 3, wherein the molar ratio of the aldehyde to the polyfunctional phenol is within the range of from 0.90 to 1.15.

* * * * *